(12) United States Patent
Takase et al.

(10) Patent No.: US 7,768,844 B2
(45) Date of Patent: Aug. 3, 2010

(54) NONVOLATILE SEMICONDUCTOR MEMORY DEVICE AND METHOD OF DRIVING THE SAME

(75) Inventors: Satoru Takase, Yokohama (JP); Takuya Futatsuyama, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 121 days.

(21) Appl. No.: 12/202,601

(22) Filed: Sep. 2, 2008

(65) Prior Publication Data

US 2009/0067243 A1 Mar. 12, 2009

(30) Foreign Application Priority Data

Sep. 3, 2007 (JP) ............................. 2007-228074

(51) Int. Cl.
*G11C 7/00* (2006.01)
(52) U.S. Cl. ............................. 365/189.14; 365/189.15; 365/189.16; 365/206
(58) Field of Classification Search ............ 365/189.14, 365/189.15, 189.16, 206
See application file for complete search history.

(56) References Cited

U.S. PATENT DOCUMENTS

| | | | | |
|---|---|---|---|---|
| 6,710,399 B2 * | 3/2004 | Kamei | ......................... | 257/319 |
| 7,193,898 B2 | 3/2007 | Cernea | | |
| 7,233,522 B2 * | 6/2007 | Chen et al. | ............. | 365/185.02 |
| 7,257,032 B2 | 8/2007 | Fujiu et al. | | |
| 2006/0146608 A1 * | 7/2006 | Fasoli et al. | ............ | 365/185.17 |
| 2006/0215454 A1 | 9/2006 | In et al. | | |
| 2007/0268732 A1 | 11/2007 | Nazarian et al. | | |
| 2008/0055985 A1 | 3/2008 | Kanda | | |

FOREIGN PATENT DOCUMENTS

| | | |
|---|---|---|
| JP | 2006-228394 | 8/2006 |
| JP | 2007-164899 | 6/2007 |

OTHER PUBLICATIONS

U.S. Appl. No. 12/324,953, filed Nov. 28, 2008, Takase, et al.
U.S. Appl. No. 12/491,638, filed Jun. 25, 2009, Futatsuyama et al.

* cited by examiner

*Primary Examiner*—Son Dinh
(74) *Attorney, Agent, or Firm*—Oblon, Spivak, McClelland, Maier & Neustadt, L.L.P.

(57) ABSTRACT

This disclosure concerns a memory including memory cell arrays including word lines extending in a first direction, bit lines extending in a second direction crossing the first direction, and memory cells provided to respectively correspond to cross-points in form of a lattice constituted by the word lines and the bit lines; sense amplifiers provided to respectively correspond to the bit lines and reading data stored in the memory cells; and bit line drivers provided to the bit lines and operating the bit lines when data is written to the memory cells, wherein the bit line drivers access the memory cells adjacent to a first memory cell diagonally with respect to the form of the lattice for writing the data to the adjacent memory cells during a data write operation without changing data stored in the memory cells adjacent to the first memory cell in the first and the second directions.

20 Claims, 9 Drawing Sheets

THIRD EMBODIMENT

NONVOLATILE SEMICONDUCTOR MEMORY DEVICE AND METHOD OF DRIVING THE SAME

CROSS-REFERENCE TO RELATED APPLICATION

This application is based upon and claims the benefit of priority from the prior Japanese Patent Application No. 2007-228074, filed on Sep. 3, 2007, the entire contents of which are incorporated herein by reference.

BACKGROUND OF THE INVENTION

1. Field of the Invention

The invention relates to a nonvolatile memory devices and a driving method thereof.

2. Related Art

In recent years, microfabrication of nonvolatile memory devices such as NAND flash memories has increasingly proceeded. If a distance between adjacent memory cells is narrower to follow microfabrication of a device, proximity effect between the memory cells becomes conspicuous. The proximity effect is the phenomenon that a memory cell is interfered with an adjacent memory cell by capacitive coupling or the like between the memory cells. For example, charges accumulated in the adjacent memory cell influences data stored in the memory cell. If the distance between the memory cells adjacent to each other is narrower, the influence of the charges accumulated in the adjacent memory cell on the cell is greater.

To correctly read data stored in a memory cell, it is necessary that a threshold voltage of the memory cell falls within a predetermined range. Normally, right after data is written to the memory cell, the threshold voltage of the memory cell falls within the predetermined range. However, if data is written to a memory cell adjacent to the memory cell, the threshold voltage of the memory cell fluctuates by the proximity effect. This causes erroneous reading of data.

Meanwhile, if a distribution width of threshold voltages of memory cells during a data write operation is set small as measures against the proximity effect, a step width of a write voltage is required to be reduced accordingly. If the step width of the write voltage is small, a data write rate is disadvantageously reduced.

SUMMARY OF THE INVENTION

A nonvolatile semiconductor memory device according to an embodiment of the present invention comprises a plurality of memory cell arrays respectively including a plurality of word lines extending in a first direction, a plurality of bit lines extending in a second direction crossing the first direction, and a plurality of memory cells provided to respectively correspond to cross-points in form of a lattice constituted by the word lines and the bit lines;

a plurality of sense amplifiers provided to respectively correspond to the bit lines and reading data stored in the memory cells; and bit line drivers provided to the bit lines and operating the bit lines when data is written to the memory cells, wherein the bit line drivers access the memory cells adjacent to a first memory cell diagonally with respect to the form of the lattice for writing the data to the adjacent memory cells during a data write operation without changing data stored in the memory cells adjacent to the first memory cell in the first and the second directions.

A nonvolatile semiconductor memory device according to an embodiment of the present invention comprises a plurality of memory cell arrays respectively including a plurality of word lines extending in a first direction, a plurality of bit lines extending in a second direction crossing the first direction, and a plurality of memory cells provided to respectively correspond to cross-points in form of a lattice constituted by the word lines and the bit lines;

a plurality of sense amplifiers provided to respectively correspond to the bit lines and reading data stored in the memory cells; and bit line drivers provided to the bit lines and operating the bit lines when data is written to the memory cells, wherein the sense amplifiers or the bit line drivers access intermittent memory cells arranged alternately for each of the word lines and select the intermittent memory cells so as to be shifted each by one pitch whenever an adjacent word line is selected.

A method of driving a nonvolatile semiconductor memory device according to an embodiment of the present invention, the nonvolatile semiconductor memory device including: a plurality of memory cell arrays respectively including a plurality of word lines extending in a first direction, a plurality of bit lines extending in a second direction crossing the first direction, and a plurality of memory cells provided to respectively correspond to cross-points in form of a lattice constituted by the word lines and the bit lines;

a plurality of sense amplifiers provided to respectively correspond to the bit lines and reading data stored in the memory cells; and bit line drivers provided to the bit lines and operating the bit lines when data is written to the memory cells, the method comprises:

during a data write operation or a data read operation, electrically connecting the sense amplifiers or the bit line drivers to first intermittent bit lines provided alternately among the plurality of bit lines in a state of selecting a first word line; and electrically connecting the sense amplifiers or the bit line drivers to second intermitted bit lines adjacent to the first intermittent bit lines and provided alternately among the plurality of bit lines in a state of selecting a second word line adjacent to the first word line.

DETAILED DESCRIPTION OF THE INVENTION

Embodiments of the present invention will be explained below in detail with reference to the accompanying drawings. Note that the invention is not limited thereto.

As stated above, as the microfabrication further proceeds, the proximity effect becomes more conspicuous. For example, if a minimum line width is about 40 nm, the proximity effect due to the capacitive coupling between adjacent cells is conspicuous. If the minimum line width is equal to or smaller than 30 nm, the proximity effect due to parasitic gate effect and parasitic resistance effect is conspicuous. The parasitic gate effect is the phenomenon that a floating gate and a control gate (word line) of an adjacent memory cell influence a channel of a memory of interest. The parasitic resistance effect is the phenomenon that potentials of a selected floating gate and a selected control gate modulate resistances of a source and a drain of a memory cell of interest.

The proximity effect of each of the above-stated types is smaller for memory cells adjacent to each other in a direction inclined with respect to an extension direction of bit lines or word lines (a column direction or a row direction) than for memory cells adjacent to each other in the extension direction. According to the embodiments of the invention, a sense amplifier accesses memory cells adjacent in a diagonal direction of a lattice shape constituted by word lines and bit lines while data stored in memory cells adjacent in a column direction and a row direction of a memory cell array is fixed. The proximity effect can be thereby suppressed and high rate data reading and high rate data writing can be realized.

Furthermore, according to the embodiments of the invention, the sense amplifier intermittently accesses bit lines BLs corresponding to a selected word line. It is thereby possible to suppress data misdetection caused by the shielding effect produced by non-accessed bit lines.

First Embodiment

Figure 1:
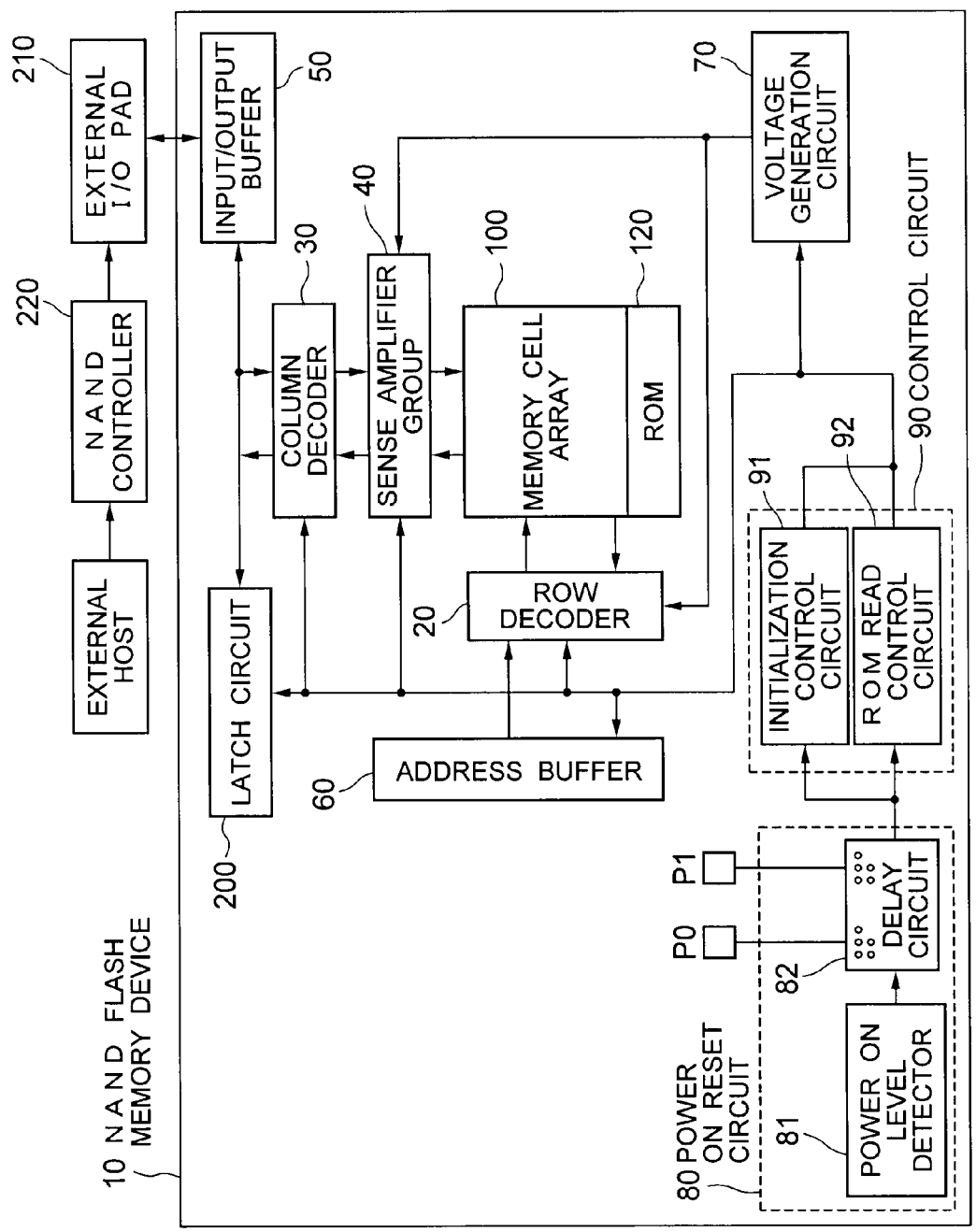
FIG. 1 is a block diagram showing an example of a configuration of a NAND flash memory device 10 according to a first embodiment of the present invention.

FIG. 1 is a block diagram showing an example of a configuration of a NAND flash memory device 10 (hereinafter, simply "memory 10") according to a first embodiment of the present invention. The memory 10 includes a memory cell array 100, a row decoder 20, a column decoder 30, a sense amplifier group 40 (including bit line driving circuits), an input/output buffer 50, an address buffer 60, a voltage generation circuit 70, a power ON reset circuit 80, a control circuit 90, a latch circuit 200, an external I/O pad 210, and a NAND controller 220. Although the memory 10 also includes a state machine, a command interface and the like, they are not shown in FIG. 1.

The NAND controller 220 outputs data and a control signal (command). The NAND controller 220 as well as the memory 10 is often incorporated in a card. The data and the control signal are input to the input/output buffer 50 via the external I/O pad 210. The input/output buffer 50 transmits the data and the control signal to the command interface and the column decoder 30. The state machine controls the column decoder 30 and the sense amplifier group 40 based on the data and the control signal. The row decoder 20 decodes the control signal and selects a certain word line WL based on an address signal. The column decoder 30 is provided between the sense amplifier group 40 and a data bus. The column decoder 30 selects one sense amplifier in the sense amplifier group 40 and transfers read data latched by the selected sense amplifier to the data path or transfers data received from outside to the selected sense amplifier.

During a data write operation, the selected sense amplifier temporarily latches the data and writes the data to memory cells connected to the selected word line WL via a bit line BL on a column corresponding to the selected sense amplifier. During a data read operation, the selected sense amplifier detects data stored in the memory cells connected to the selected word line WL. The sense amplifier outputs the read data to the outside of the memory 10 via the input/output buffer 50 and the external I/O pad 210. Each sense amplifier writes or reads data in units of pages each including, for example, 8-bit data or 16-bit data.

The address buffer 60 encodes address information received from the outside and transmits the encoded address information to the row decoder 20 and the column decoder 30.

The voltage generation circuit 70 receives a mode signal, a voltage generation timing control signal, and a voltage level setting signal from the control circuit 90, and generates a reference voltage Vref for reference or internal voltages such as a program voltage Vpgm using a power supply voltage VCC supplied from the outside. The voltage generation circuit 70 supplies the internal voltage to the row decoder 20, the column decoder 30, the sense amplifier group 40, and the like.

The power ON reset circuit 80 detects power ON, resets a register (not shown) in the control circuit 90, and outputs a signal for performing an initialization operation. The power ON reset circuit 80 outputs a power ON reset signal that is kept low level until the power supply voltage reaches a predetermined voltage level after power ON and that becomes high level when the power supply voltage reaches the predetermined voltage level to the control circuit 90.

The control circuit 90 generates the mode signal indicating the data read operation, the data write operation, a data erasure operation or the like according to the control signal (command) received from the outside. Further, the control circuit 90 outputs a timing control signal indicating a timing of generating a necessary voltage in each mode, a voltage setting signal indicating a set voltage stored in the register, an address control signal, and an access control signal controlling an access to the memory cells. In response to the power ON reset signal, an initialization control circuit 91 outputs a control signal for initializing the address buffer 60, the row decoder 20, the column decoder 30, the sense amplifier group 40, the latch circuit 200, and the voltage generation circuit 70. In response to the power ON reset signal, a ROM read control circuit 92 outputs a control signal for starting a ROM read operation.

The ROM 120 stores therein trimming data for timer adjustment and various voltage adjustment, various data (fuse data) necessary to read after power ON, replacement address data (redundancy data) for replacing a defective cell present in the memory cell array 100 by another redundant cell, and the like. The fuse data and the redundancy data stored in the ROM 120 are transmitted to the latch circuit 200 via the sense amplifier group 40 and the column decoder 30 and held in the latch circuit 200. This operation is called "ROM read operation".

The sense amplifier group 40 includes a plurality of sense amplifiers provided to correspond to the bit lines BLs, respectively. Each sense amplifier reads data stored in memory cells MCs or writes data to the memory cells MCs via the corresponding bit line BL. Each sense amplifier is configured to be able to temporarily hold the read data or the data to be written.

Figure 2:
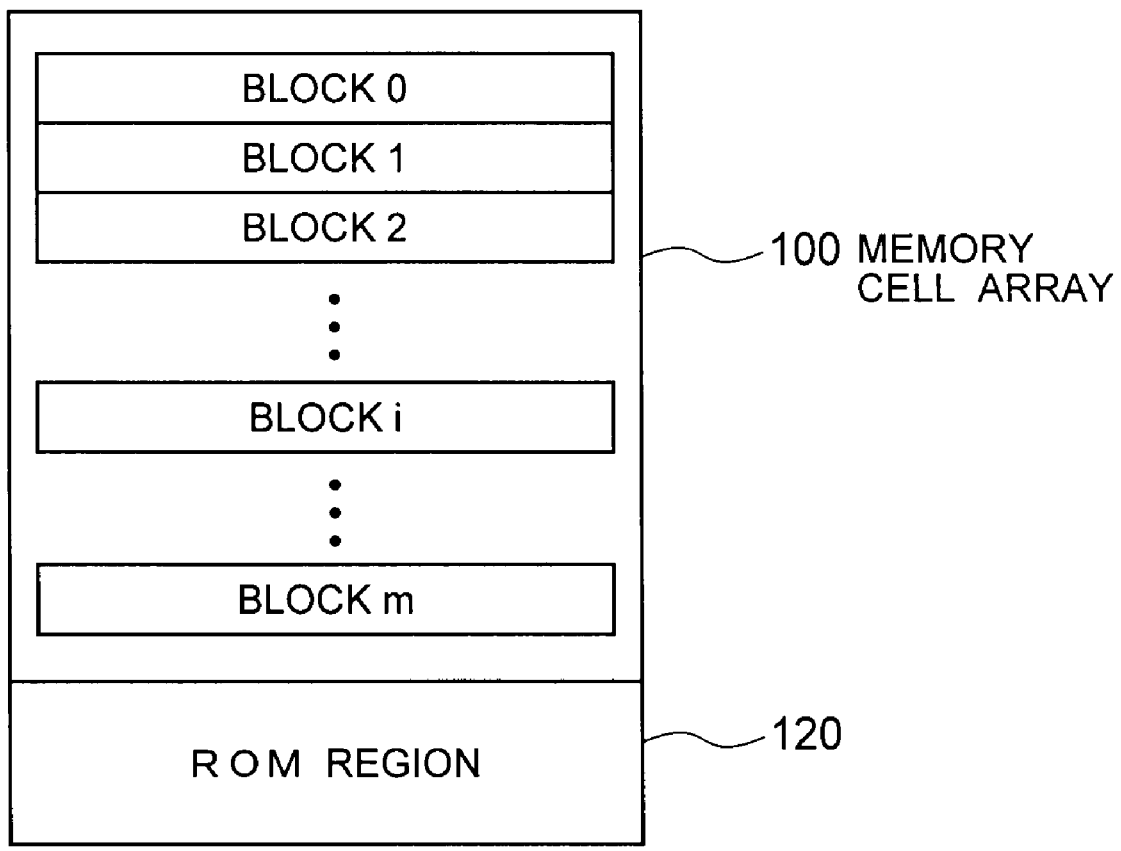
FIG. 2 is a schematic diagram showing an example of a configuration of the memory cell array 100.

FIG. 2 is a schematic diagram showing an example of a configuration of the memory cell array 100. The memory cell array 100 is divided into memory cell blocks (hereinafter, also "blocks") BLOCK0 to BLOCKm. In the example shown in FIG. 2, each of the blocks BLOCK0 to BLOCKm is a minimum unit for erasing data. Each of the blocks BLOCK0 to BLOCKm can be configured to include an arbitrary number of memory cells MCs. Each of the blocks BLOCK0 to BLOCKm is constituted by a plurality of pages. A page is a unit for reading or writing data. Each page corresponds to one word line WL and is configured to include data stored in a plurality of memory cells MCs identified by a certain row address.

Figure 3:
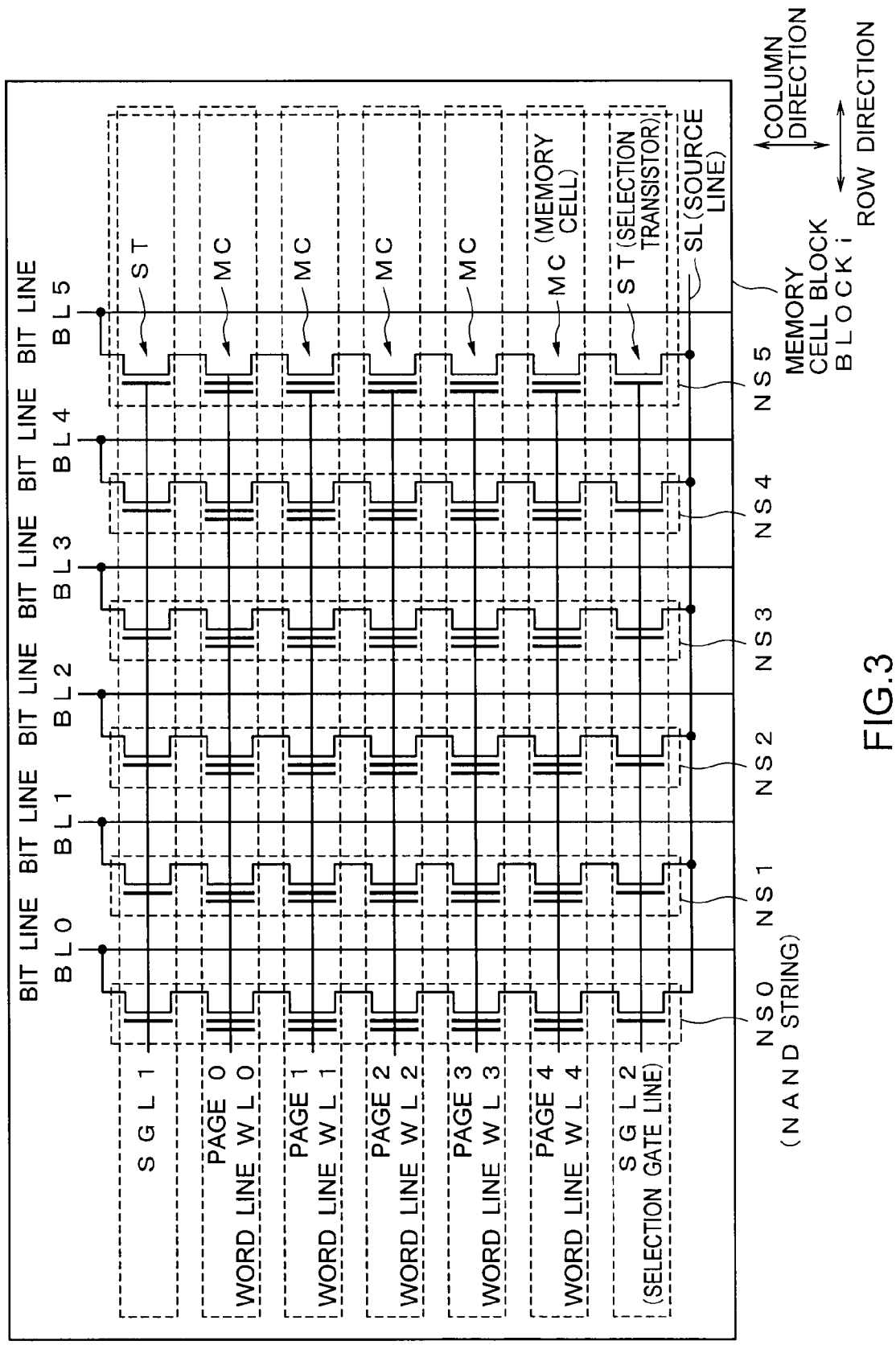
FIG. 3 is a schematic diagram showing an example of a configuration of each of the blocks BLOCK0 to BLOCKm.

FIG. 3 is a schematic diagram showing an example of a configuration of each of the blocks BLOCK0 to BLOCKm. A certain block BLOCKi (i=0 to m) includes a plurality of NAND strings NSs provided to correspond to the bit line BL on one column. Each of the NAND strings NSs is configured to include a plurality of memory cells MCs connected in series and selection gate transistors STs connected to both ends of the memory cells, respectively. One end of each NAND string NS is connected to the corresponding bit line BL and the other end thereof is connected to a common source line SL. For example, a NAND string NSi (i=0 to 5) is connected to a bit line BLi (i=0 to 5).

A control gate of each memory cell MC is connected to the word line WL on the page to which the memory cell MC belongs. For example, the control gate of each memory cell MC belonging to a page i (i=0 to 4) is connected to a word line WLi (i=0 to 4). A gate of each selection transistor ST is connected to a selection gate line SGL1 or SGL2.

A plurality of word lines WLs extends in a row direction that is a first direction and a plurality of bit lines BLs extends in a column direction that is a second direction crossing the row direction almost orthogonally. Since the row direction and the column direction are denoted for the sake of convenience, the first direction can be set as the column direction and the second direction can be set as the row direction.

As shown in FIG. 3, memory cells MCs are provided to correspond to crosspoints of a lattice constituted by the word lines WLs and the bit lines BLs, respectively. For example, crosspoints of a lattice constituted by word lines WL0 to WL4 and bit lines BL0 to BL5 are located in a matrix of 5×6. The memory cells MCs are arranged two-dimensionally in the matrix of 5×6 to correspond to these crosspoints, respectively. In the first embodiment, each block includes 5×6 (=30) memory cells MCs. However, the number of memory cells MCs in one block is not limited to 30. That is, the number of word lines WLs and the number of bit lines BLs are not limited to five and six, respectively.

Each memory cell MC is constituted by an n-FET (Field-Effect Transistor) including a floating gate and a control gate. A potential is applied to the control gate by the corresponding word line WL, and charges (electrons) are accumulated in or emitted from the floating gate. By doing so, data is written to the memory cell MC or data stored in the memory cell MC is erased. The memory cell MC can electrically store therein binary data or multivalued data according to the number of charges (electrons) accumulated in the floating gate.

A method of applying the technique according to the first embodiment mainly to the flash memory has been described so far. The technique according to the first embodiment is also applicable to a resistance random access memory (ReRAM). In case of the ReRAM, a state of each memory cell is changed according to temperature change and the memory cell stores therein the difference in electric resistance as information. Each memory cell MC is exposed to high temperature when the state of the memory cell MC is changed. The heat has a more than a little influence on adjacent memory cells MCs to the memory cell. This influence is more conspicuous as microfabrication proceeds. That is, even the ReRAM has the problem of inter-cell proximity effect to follow the microfabrication. Diagonal access is effective again to solve the problem with the ReRAM. This is because the distance between the memory cells MCs adjacent diagonally is larger than that of memory cells MCs adjacent in word line direction or bit line direction. In other words, the amount of the proximity effect influencing the diagonally adjacent memory cells MCs is smaller. Due to this, if the diagonal access is performed, inter-cell interference is suppressed and the change the state in resistance can be realized at high rate. In case of full access to cells, by contrast, a large capacity of data can be held. As can be seen, the ReRAM enjoys advantages of the flash memory stated so far, so that the technique according to the first embodiment is also effective if being applied to the ReRAM.

Furthermore, the method according to the first embodiment is effective for the overall memory device in which storage elements are arranged in the lattice shape. Generally, to meet the demand of larger capacity, memory elements are increasingly downsized and the distance between the memory elements is made narrower. At this time, there is no avoiding the adverse influence of the proximity effect produced between the adjacent memory cells MCs. In this case, a method of eliminating the adverse influence of the proximity effect by causing the proximity effect to appear small using the fact that a diagonal distance is larger than a cross distance is quite effective in most cases. That is, the method according to the first embodiment is effectively applied to not only the flash memory and the ReRAM described above but also a memory device in which memory elements are arranged in the lattice shape as shown in FIG. 4.

Figure 4:
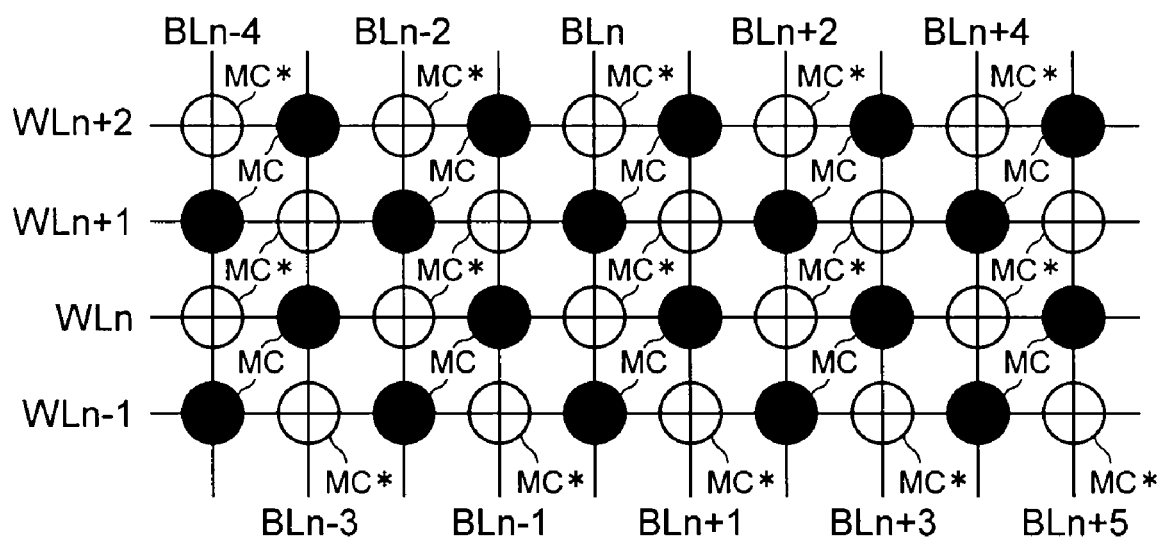
FIG. 4 is a schematic diagram showing an example of a method of driving the memory 10 according to the first embodiment.

FIG. 4 is a schematic diagram showing an example of a method of driving the memory 10 according to the first embodiment. In FIG. 4, each memory cell MC is indicated by a circle for brevity. Further, in FIG. 4, memory cells MCs in a matrix of 4×10 is displayed as a part of the memory cell array 100.

In the first embodiment, during the data write or read operation, each sense amplifier accesses the memory cells MCs shown in FIG. 4 but does not access memory cells MC*s. The accessed memory cells MCs are arranged in the form of a checkered flag whereas the non-accessed memory cells MC*s are also arranged in the form of a checkered flag to fill in the memory cells MCs. In the example shown in FIG. 4, the memory cells MC and MC* are identical in structure.

If attention is paid to a memory cell MC of interest, the sense amplifier accesses the memory cells MCs adjacent to the memory cell MC of interest diagonally in the form of the lattice constituted by the word lines WLs and the bit lines BLs in a state in which data stored in the memory cells MC* adjacent to the memory cell MC of interest in the row direction and the column direction is fixed. That is, the sense amplifier accesses the memory cells MCs arranged aslant (diagonally) with respect to the memory cell MC of interest and executes the data read or write operation on the accessed memory cells MCs. On the other hand, the sense amplifier does not access the memory cells MCs adjacent to the memory cell MC of interest in extension directions of the word lines WLs and the bit lines BLs.

In other words, the sense amplifier alternately (intermittently) selects bit lines BLs connected to a selected first word line and accesses first intermittent memory cells MCs connected to the selected first intermittent bit lines BL. However, the sense amplifier does not access the memory cells MC*s between the adjacent first intermittent bit lines BLs among the memory cells MCs and MC*s connected to the first word line WL. If the sense amplifier selects a second word line WL adjacent to the first word line WL, then the sense amplifier selects second intermittent bit lines BLs between the first intermittent bit lines BLs and accesses second intermittent memory cells MCs connected to the second intermittent bit lines BLs. At this time, the sense amplifier alternately (intermittently) selects the second intermittent bit lines BLs. However, the sense amplifier does not access the memory cells MC*s connected to the first intermitted bit lines BLs among the memory cells MCs and MC*s connected to the second word line WL. In this way, the sense amplifier alternately (intermittently) accesses memory cells MCs so as to shift by one pitch whenever selecting the adjacent word line WL. By doing so, data is stored only in the memory cells MCs arranged orthogonally in the form of the lattice constituted by the word lines WLs and the bit lines BLs. All the memory cells MC*s are kept erased and no write operation is performed on the memory cells MC*s.

An operation for causing the sense amplifier to access only the memory cells MCs arranged diagonally in the form of the lattice will be referred to as "diagonal access", hereinafter. A memory cell array accessed by the diagonal access will be referred to as "diagonal access array", hereinafter. A memory block accessed by the diagonal access will be referred to as "diagonal access block", hereinafter. In contrast, an operation for causing the sense amplifier to access all memory cells MCs arranged at the lattice crosspoints, respectively will be referred to as "full access", hereinafter. A memory cell array accessed by the full access will be referred to as "full access array", hereinafter. A memory block accessed by the full access will be referred to as "full access block", hereinafter.

An example of the data write operation performed by the memory 10 according to the first embodiment is described below. For example, if a word line WLn shown in FIG. 4 is selected, data is written to memory cells MCs connected to bit lines BLn−3, BLn−1, BLn+1, BLn+3, and BLn+5 (hereinafter, also "odd bit lines BLs").

If electrons are injected into the floating gate of each of the memory cells MCs (if "0" is written to each of the memory cells MCs) connected to the odd bit lines BLs, a voltage of 0 V is applied to the odd bit lines BLs. If electrons are not injected into the floating gate thereof (if "1" is written thereto), the power supply voltage VDD is applied to the odd bit lines BLs. During the data write operation, the selection gate line SGL1 shown in FIG. 3 is high level (VDD) and the selection gate line SGL2 is low level (VSS). That is, at this time, bit line-side selection transistors STs are turned on and source line-side selection transistors STs are turned off.

Next, a voltage of about 20 V is applied as the write voltage (program voltage) Vpgm is applied to the selected word line WLn and a voltage of about 10 V is applied as an intermediate voltage Vpass to the other unselected word lines WLn−1, WLn+1, and WLn+2. At this time, on the odd bit lines BLs to which the voltage of 0 V is applied, the bit line-side selection transistors STs are kept to be turned on. A voltage of 0 V is thereby applied to channel of the memory cells MCs connected to the selected word line WLn and a potential difference of about 20 V is generated between the control gate and the channel of each of these memory cells MCs. As a result, electrons are accumulated in the floating gate of each of these memory cells MCs by NF tunneling, thus completing writing data "0" to the memory cells MCs.

Meanwhile, on the odd bit lines to which the power supply voltage VDD is applied, a voltage (VDD−Vth_ST) lower than the power supply voltage VDD by a threshold voltage (Vth_ST) of the bit line-side selection transistors STs is applied to the channel of each of the memory cells MCs. If a channel potential becomes higher than VDD−Vth_ST by a voltage of the selected word line WLn, the bit line-side selection transistors STs are turned off. A potential of the channel of each memory cell MC thereby rises to a potential determined by a capacity ratio of the selected word line WLn to the channel. As a result, electrons are not accumulated in the floating gate and data "1" is kept stored in each memory cell MC.

If the word line WLn is selected, potentials of the bit lines BLn−4, BLn−2, BLn, BLn+2, and BLn+4 (hereinafter, "even bit lines") are fixed to VDD. Due to this, no data write operation is performed on each of the memory cells MCs corresponding to the even bit lines BLs and each of these memory cell MCs is kept erased.

Next, if the word line WLn+1 is selected, the sense amplifiers do not access the memory cells MC*s connected to the odd bit lines BLs but write data only to the memory cells MCs connected to the even bit lines BLs, respectively. Since the data write operation in relation to the word line WLn+1 can be easily estimated from the data write operation in relation to the word line WLn, it will not be described herein. At this time, if the word line WLn+1 is selected, potentials of the odd bit lines BLs are fixed to VDD. In this manner, the memory 10 according to the first embodiment writes data to the memory cells MCs using the diagonal access while selecting the word lines WLs in order of address.

An example of the data read operation performed by the memory 10 according to the first embodiment is described below. For example, data stored in the memory cells MCs connected to the selected word line WLn is read. In this case, a voltage of 0 V is applied to the selected word line Wn whereas voltage of about 4.5 V is applied to unselected word lines WLn−1, WLn+1, and WLn+2. By doing so, data stored in the memory cells MCs connected to the selected word line WLn can be read without destroying data stored in the memory cells MCs connected to the unselected word line WLn−1, WLn+1, and WLn+2. At this time, the bit line-side selection transistors STs and the source line-side selection transistors STs are both turned on.

One of methods of reading data is exactly the same as a conventional method of reading data. That is, all sense amplifiers are activated and data on all the bit lines BLs corresponding to the selected word line WL is activated. Thereafter, only sense amplifier data according to the diagonal access is used. The other data is abandoned without being transmitted to next stage.

Another method of reading data is a method causing each sense amplifier not to access the memory cells MC*s even in the data read operation. In this case, if the word line WLn is selected, only the data stored in the memory cells MCs connected to the odd bit lines BLs is read and data stored in the memory cells MC*s connected to the even bit lines BLs is not read. At this time, the sense amplifiers connected to the even bit lines BLs, respectively can be made inactive to reduce power consumption. If the word line WLn+1 is selected, then data stored in the memory cells MCs connected to the even bit lines BLs is read and data stored in the memory cells MC*s connected to the odd bit lines BLs is not read. At this time, the sense amplifiers connected to the odd bit lines BLs, respectively can be made inactive to reduce the power consumption. In this way, during the read data operation, potentials of half the bit lines BLs can be set to the fixed potential because data is not read from the memory cells connected to half the bit lines BLs. Since the bit lines BLs having the fixed potential function as a shield against the bit lines BLs corresponding to the memory cells MCs subjected to the data read operation, the fixed-potential bit lines BLs enable the bit lines BLs corresponding to the memory cells MCs subjected to the data read operation to stably operate.

Since a data erase operation is performed for every block similarly to the conventional technique, the data erase operation will not be described herein.

According to the first embodiment, each memory cell MC can store therein binary data as described above. Alternatively, the memory cell MC can store therein multivalued data in place of the binary data. An example of an operation (LM (Lower Middle) scheme) for writing four-valued data (2-bit data) to each memory cell MC will be described.

Figure 5:
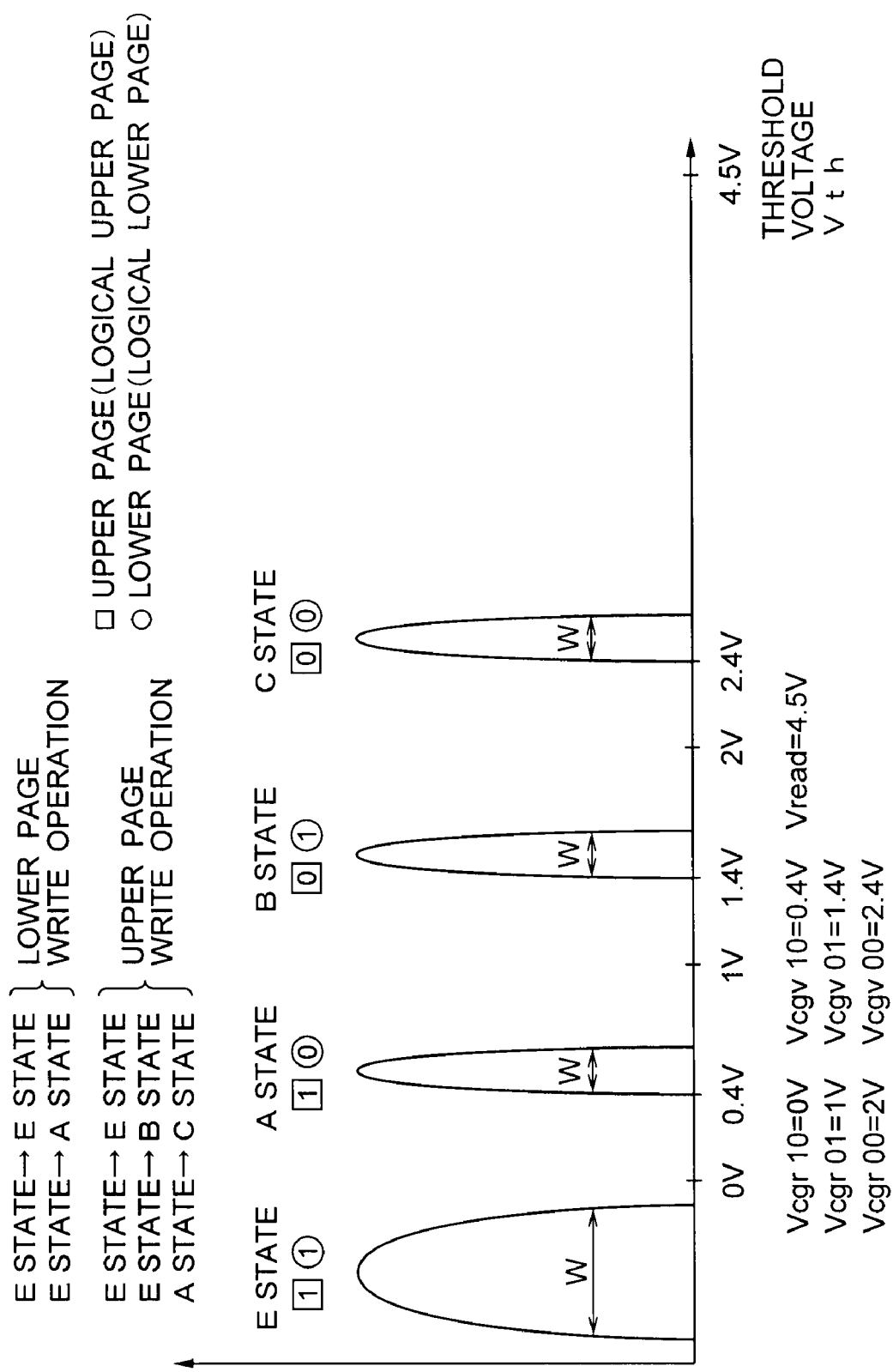
FIG. 5 is a graph showing the threshold voltages of the memory cells MCs storing therein four-valued data.

FIG. 5 is a graph showing the threshold voltages of the memory cells MCs storing therein four-valued data. Each memory cell MC stores therein one of the four-valued data (11, 10, 01, and 00). A lower bit of the four-valued data is stored as Lower Page Data and an upper bit thereof is stored as Upper Page data in each memory cells MC. In FIG. 5, the Lower Page data is indicated by a circle whereas the Upper Page data is denoted by a rectangle. In FIG. 5, a vertical axis denotes the number of memory cells MCs. Accordingly, a width of a curve indicating each state denotes a threshold voltage fluctuation. It is, therefore, preferable that the width W of each curve is small.

E state (11) is an Erase state in which data "0" is not written to each memory cell MC as the Lower Page data or the Upper Page data. Before the data write operation, all the memory cells MCs are in the E state. In the E state, the threshold voltage of each memory cell MC is negative. In the other A to C states, threshold voltages are those in data write states and are set to positive voltages from 0 V to 5 V.

The four-valued data is written by two operations of a Lower Page write operation and an Upper Page write operation. The Lower page write operation determines Lower Page data. A data state of the Lower Page Data of each memory cell MC is thereby sorted to either the E state or the B state or the A state and or C state. The Upper Page write operation determines Upper Page data. The data state of the Upper Page Data of each memory cell MC is thereby sorted to one of the E state, the B state, the A state, and the C state.

In the Lower Page write operation, if Lower Page data is to be kept 1, the bit lines BLs are set high level, thereby preventing electrons from being accumulated in the floating gate of each memory cell MC connected to the selected word line WL. By doing so, each memory cell MC is kept in the E state (erase state). If 0 is to be written as the Lower Page data, the bit lines BLs are set low level, thereby accumulating electrons into the floating gate of each memory cell MC connected to the selected word line WL. By doing so, 0 is written as the Lower Page data and the memory cell MC is turned into the A state.

In the Upper Page write operation, if Upper Page data is to be kept 1, the bit lines BLs are set high level, thereby preventing electrons from being accumulated into the floating gate of each memory cell MC connected to the selected word line WL. By doing so, each memory cell MC in the E state is kept in the E state (erase state) and each memory cell MC in the A state is kept in the A state. If 0 is to be written as the Upper Page data, the bit lines BLs are set low level, thereby accumulating electrons into the floating gate of each memory cell MC connected to the selected word line WL. If 0 is written to each memory cell MC in the E state as the Upper Page data, the memory cell MC is turned into the B state. If 0 is written to each memory cell MC in the A state as the Upper Page data, the memory cell MC is turned into the C state. The voltage of the selected word line WL during the Upper Page write operation is set higher than that during the Lower Page write operation. Alternatively, the potential of each bit line BL during the Upper Page write operation is set lower than that during the Lower Page write operation. By setting so, a quantity of electrons accumulated in the floating gate of each memory cell MC during the operation of writing 0 to each memory cell MC as the Upper Page data becomes larger than that during the operation of writing 0 to each memory cell MC as the Lower Page data. Accordingly, the threshold voltage of each memory cell MC in the B state is higher than that of the memory cell MC in the A state and the A state (10) can be discriminated from the B state (01). In this way, each memory cell MC could be turned into the four states of E, A, B, and C states according to the threshold voltage of the memory cell MC.

Vcgr10 is a voltage applied to the control gate of each memory cell MC if data (10) is to be discriminated from data (11) during the data read operation. Vcgr01 is a voltage applied to the control gate of each memory cell MC if data (01) is to be discriminated from data (10) during the data read operation. Vcgr00 is a voltage applied to the control gate of each memory cell MC if data (00) is to be discriminated from data (01) during the data read operation. For example, if the threshold voltage of one memory cell MC is lower than the Vcgr10 (0 V), the memory cell MC is in the E state (11). If the threshold voltage of each of the memory cells MC except for the memory cells MCs determined to be in the E state is lower than the Vcgr01 (1 V), each of the memory cells MCs is in the A state (10). If the threshold voltage thereof is lower than the Vcgr00 (2 V), each of the memory cells MCs is in the B state (10). The other memory cells MCs are determined to be in the C state (00).

Furthermore, Vcgv10 shown in FIG. 5 is a voltage applied to the control gate of each memory cell MC during data (10) verify read and set to have a certain margin (e.g., 0.4 V) with respect to the Vcgr. The Vcgv10 is, for example, 0.4 V. Vcgv01 is a read voltage used for data (01) verify read and, for example, 1.4 V. Vcgv00 is a read voltage used for data (00) verify read and, for example, 2.4 V. Vread is a voltage applied to the control gate of each unselected memory cell MC during the data read operation.

In the first embodiment, multivalued data is written to the memory cells MCs in the memory cell array 100 by the diagonal access. Accordingly, the memory cells MCs shown in FIG. 4 store therein multivalued data whereas the memory cells MC*s do not store therein multivalued data (the memory cells MC*s are kept in the erase state).

The four-valued data can be read by three read steps. For example, in a first step, the Vcgr10 (0 V) is applied to the control gate of each memory cell MC. The memory cells MCs in the E state can be thereby detected. In a second step, the Vcgr00 (2 V) is applied to the control gate of each memory cell MC. The memory cells MCs in the C state can be thereby detected. In a third step, the Vcgr01 (1 V) is applied to the control gate of each memory cell MC. The memory cells MCs in the A and B states can be thereby detected.

In the first embodiment, the multivalued data is read from the memory cells MCs in the memory cell array 100 by the diagonal access. Accordingly, in the operation of reading the multivalued data, each sense amplifier accesses the memory cells MCs shown in FIG. 4 but does not access the memory cells MC*s. If the full access is used, each sense amplifier accesses all the memory cells MCs.

In the memory 10 according to the first embodiment, data is stored only in the memory cells MCs arranged diagonally in the form of the lattice constituted by the word lines WLs and the bit lines BLs among the memory cells MCs and MC*s in the memory cell array 100 as shown in FIG. 4. The sense amplifiers do not access the other memory cells MC*s. By employing the diagonal access as described above, each memory cell MC is free from the proximity effect produced by the memory cells MC*s adjacent to the memory cell MC in the word line direction and the bit line direction. As already described, the proximity effect produced by the memory cells MCs adjacent to the memory cell MC of interest in the word line direction and the bit line direction is great whereas that produced by the memory cells MCs adjacent to the memory cell MC of interest diagonally in the form of the lattice is small. It is, therefore, possible to suppress the proximity effect caused by the microfabrication of the memory and realize high rate data read and high rate data write operations.

During the diagonal access, potentials of the non-accessed bit lines BLs are fixed. Therefore, the shield effect produced by the non-accessed bit lines BLs can stabilize the potentials (data) of the accessed bit lines BLs. Each sense amplifier can thereby execute stable data detection, thereby making it possible to suppress data misdetection.

Figure 6:
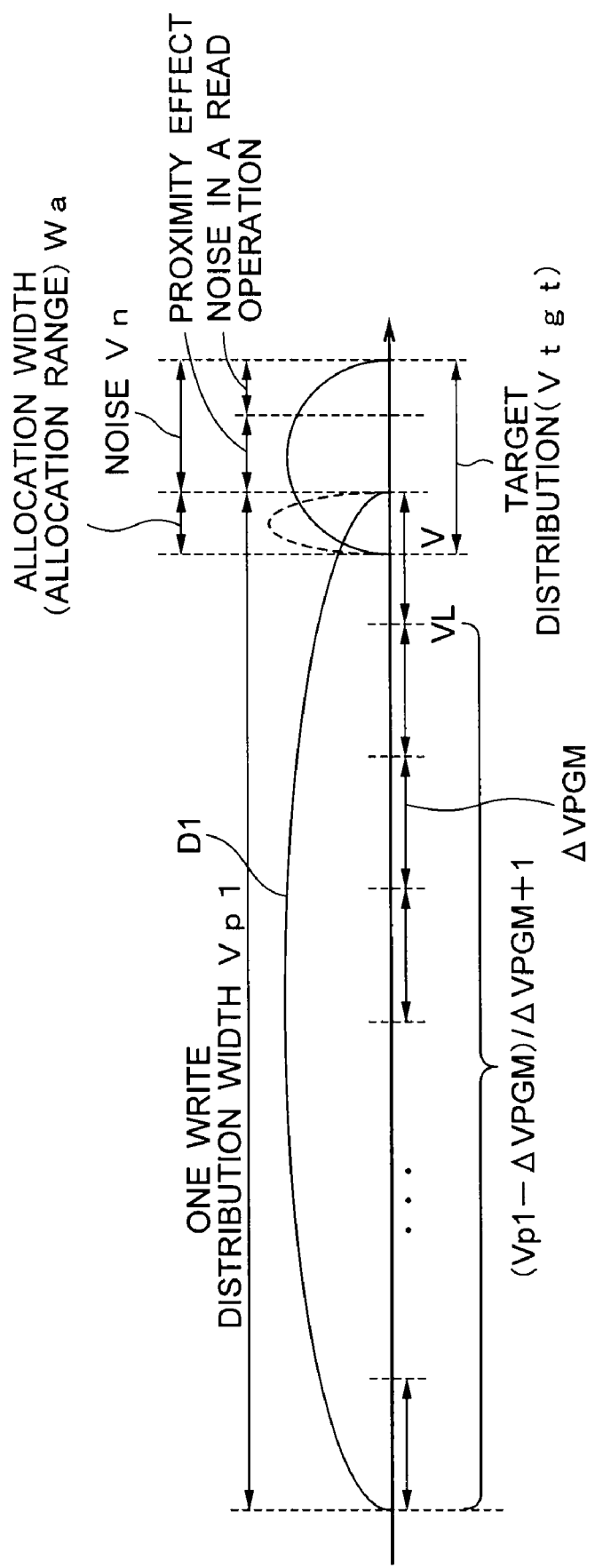
FIG. 6 is an explanatory diagram showing a write operation time.

FIG. 6 is an explanatory diagram showing a write operation time. FIG. 6 shows QWR (Quick Pass Write) by way of example. In FIG. 6, a horizontal axis indicates threshold voltage similarly to the horizontal axis shown in FIG. 5. The threshold voltage of each memory cell MC needs to fall within a range of a target distribution Vtgt for writing data. The threshold voltage actually allocated to each memory cell MC (practically in the target threshold voltage distribution) is within an allocation width Wa as indicated by a broken line. However, if the proximity effect and a noise component Vn including noise during the data read operation are considered, the target threshold distribution enlarges to a range indicated by Vtgt.

Generally, the threshold voltages of all the memory cells MCs cannot be shifted to fall within the target distribution Vtgt simply by performing data write operation once (by one potential application operation). In the one potential application operation, the threshold voltages are distributed in a wide range such as one write operation distribution D1. Next, a write step is repeated so that the threshold voltages do not exceed the allocation range Wa. At this time, the potential of the selected word line WL is increased step by step for every write step. By doing so, data is written to each memory cell MC so that the threshold voltage of the memory cell MC rises by a step voltage width $\Delta$VPGM in each write step. The step voltage width $\Delta$VPGM is twice as large as the allocation width (allocation range) Wa. In each write step, a weak write operation is performed on each memory cell MC the threshold voltage of which is from VL to the allocation range Wa so as to shift the threshold voltage by (½)$\Delta$VPGM. By doing so, the threshold voltage from VL to the allocation range Wa does not exceed the allocation range Wa. By repeating this write step, the threshold voltages distributed in the one write distribution width Vp1 are shifted to fall within the allocation range Wa. If the noise component Vn is considered as described above, the threshold voltage of each memory cell MC actually falls within the target distribution Vtgt.

The number of write steps after the one write step is (Vp1–$\Delta$VPTG)/$\Delta$VPGM+1. Therefore, to reduce the number of write steps, it is necessary to set the step width $\Delta$VPGM large. As evident from FIG. 6, if the proximity effect can be reduced, the allocation width Wa of the threshold voltage with respect to the target distribution can be increased. Since the step width $\Delta$VPGM is twice as large as the allocation width Wa, the step width $\Delta$VPGM is made large by increasing the allocation width Wa.

In the first embodiment, since the proximity effect can be reduced by the diagonal access, the step width $\Delta$VPGM as well as the allocation width Wa of each threshold can be increased. The number of write steps can be thereby reduced. That is, the data write rate can be accelerated.

Furthermore, if the proximity effect is great, a method of reading data while correcting the proximity effect is often used. For example, if data is to be read from the memory cells MCs connected to the selected word line WLn by the full access normally used in recent nonvolatile memories, data on the word line WLn is corrected to cancel the proximity effect based on data on the adjacent word line WLn+1 (DLA (Direct Look Ahead) method). According to the first embodiment, however, since the proximity effect is small, such data correction is unnecessary. As a result, the data read rate can be also accelerated.

Moreover, since half the memory cells MC*s in the NAND strings NSs are kept in the erase state, back pattern noise generated by the data stored in the unselected memory cells MCs can be suppressed to half or less than half. Since the threshold voltage of each memory cell MC* is kept low, cell current flowing across the NAND string NSs increases. This can further accelerate the data read operation and increase a read data margin (signal difference according to data). Besides, S-factor (sub-threshold characteristic) is improved, so that stable high rate read operation can be realized.

Second Embodiment

Figure 7:
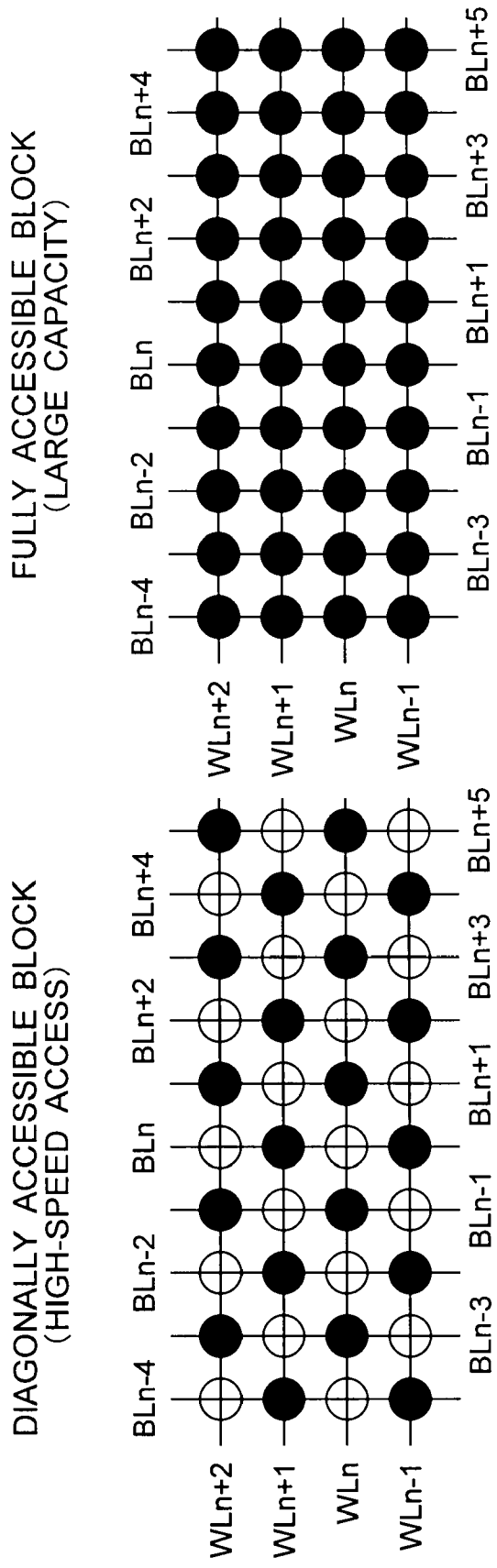
FIG. 7 is a schematic diagram showing a configuration of a memory 10 according to a second embodiment of the present invention.
Figure 8:
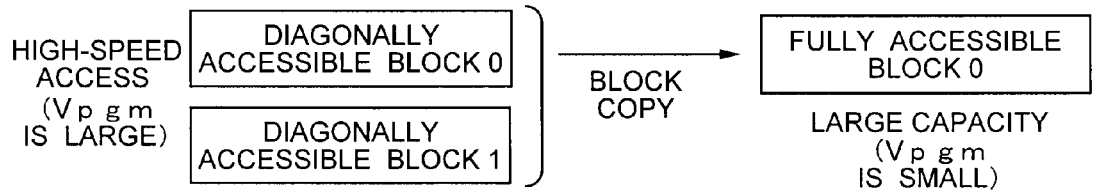
FIG. 8 shows concept of the flexible compression.

FIG. 7 is a schematic diagram showing a configuration of a memory 10 according to a second embodiment of the present invention. The overall configuration of the memory 10 can be similar to that shown in FIGS. 1 to 3. The memory 10 according to the second embodiment includes diagonally accessible blocks and fully accessible blocks, and compresses data of two diagonally accessible blocks and collectively copies the compressed data to one fully accessible block (hereinafter, the compression-copying operation will be also referred to as "flexible compression"). An access rate of an access to a diagonally accessible block is higher than that to a fully accessible block. A storage capacity of a fully accessible block is larger than that of a diagonally accessible block. Accordingly, during the data write operation, data is written to diagonally accessible blocks by the diagonal access and, after writing thereto, data stored in the two diagonally accessible blocks is flexibly compressed into one fully accessible block. The flexible compression can be performed by a conventional block copying operation. FIG. 8 shows concept of the flexible compression. By using the flexible compression, the memory 10 according to the second embodiment can perform both high rate data write operation and large capacity data storage operation. For example, if the data write operation is executed intermittently, the flexible compression can be executed in a waiting time (spare time or as background ready state) between a certain data write operation and a next data write operation. The user can thereby use the memory 10 without being conscious of the flexible compression. After executing the flexible compression, released diagonally accessible blocks can be reused as diagonally accessible blocks to be accessed at high rate. It is preferable that data subjected to the flexible compression is corrected by an ECC (Error Correcting Code) function executed by the NAND controller 220 or the like and then compression-copied.

In the second embodiment, an access method is set in units of blocks. Alternatively, the access method can be set in units of arrays or in units of word lines (pages). Accordingly, the flexible compression can be executed in units of memory cell arrays or in units of memory cell blocks. Besides, the flexible compression can be executed in units of word lines.

The NAND controller 220 shown in FIG. 1 or an external host determines a timing of starting the flexible compression. Alternatively, a NAND chip main body can determines the timing. For example, if a bock is not accessed for a certain time after end of the data write operation, the NAND controller 220 or the external host outputs a control signal indicating start of the flexible compression. Alternatively, the NAND controller 220 or the external host can output the control signal indicating start of the flexible compression right after the end of the data write operation. If the flexible compression starts right after the end of the data write operation, a command conventionally output from the NAND controller 220 after the end of the data write operation can be used as the control signal. For example, during the flexible compression, the NAND controller 200 indicates the external host that a state of the memory 10 is either a background ready state or a busy state.

The flexible compression can be started based on an amount of data written to the memory 10. For example, if the amount of written data exceeds a predetermined threshold, the memory 10 forcibly starts the flexible compression. The memory 10 can thereby start the flexible compression before the amount of written data exceeds a storage capacity of a diagonally accessible region. As a result, the memory 10 can store therein a large capacity of data while securing the high rate access performance. The method of starting the flexible compression based on the amount of written data is advantageous if a large amount of data is written collectively to the memory 10. A threshold of the amount of written data can be set, for example, between 50% and 100% of the storage capacity of the diagonally accessible region. This threshold is preferably designated by the user.

In another alternative, the flexible compression can be started based on the number of remaining diagonally accessible blocks to which data can be written. If this alternative method is used, similarly to the previous methods, the memory 10 can start the flexible compression before the amount of written data exceeds the storage capacity of the diagonally accessible region. This alternative method is also advantageous if a large amount of data is collectively written to the memory 10.

In still another alternative, the timing of starting the flexible compression can be determined based only on time. For example, if a diagonally accessible block is not accessed for a certain time, it is determined that the block is subjected to flexible compression.

A diagonally accessible array (diagonally accessible blocks) and a fully accessible array (fully accessible blocks) can be discriminated from each other by providing a flag (one-bit data) to each array or each block. The flag can be stored in the ROM 120 shown in FIG. 1. If the flexible compression is executed in units of word lines, an existing flag provided for every word line can be used as the flag of each array or each block. Information of the flag determines which sense amplifiers are to be activated.

The flag is also used during the data read operation. For example, if a block including a read target memory cell MC is a fully accessible block, the sense amplifiers read data by ABL (All Bit Line) method similarly to the conventional technique. In this case, the sense amplifiers read data on all columns connected to the selected word line WL. A part of or all of the data read by the sense amplifiers is read to outside of the memory 10 from the sense amplifiers. If the block including a read target memory cell MC is a diagonally accessible block, the sense amplifiers connected to odd bit lines BLs or those connected to even bit lines BLs read data, respectively. A part of or all of the data read by the sense amplifiers is read to outside of the memory 10 from the sense amplifiers.

A compression target diagonally accessible block can be designated by an address transmitted from the NAND controller 220 or the external host. Alternatively, compression target diagonally accessible blocks can be sequentially designated in order of addresses. In another alternative, compression target diagonally accessible blocks can be designated by addresses at random. By designating the compression target diagonally accessible blocks in order of addresses or at random, memory cell deterioration states of all the blocks can be averaged.

In still another alternative, the compression target diagonally accessible block can be designated by LRU (Least Recent Used) method. The LRU method is a method of designating a compression target diagonally accessible block least recently accessed. A probability of read/write access to old data stored in such a least recently accessed diagonally accessible block is estimated to be low. The data having such a low access probability can be estimated to be less necessary to access at high rate. By preferentially compression-copying such old data to a fully accessible block, the diagonally accessible blocks and the fully accessible blocks can be used efficiently.

Many methods are known as a method of realizing the LRU. For example, the following methods are known as simple LRU methods. Whether a diagonally accessible block stores therein old data is determined using the flag provided to correspond to each diagonally accessible block. If the diagonally accessible block is accessed, the flag of the block is set on. A diagonally accessible block the flag of which is not on just before the start of the flexible compression is determined as a diagonally accessible block that is not recently accessed. Data stored in the diagonally accessible block that is not recently accessed is preferentially compression-copied. The flag of each block is reset at intervals of execution of the flexible compression or at regular intervals. This can prevent flags of all the blocks from being set on.

If a block including a read target memory cell MC is a diagonally accessible block, sense amplifiers connected to odd bit lines or those connected to even bit lines read data stored in the block. A part of or all of the data read by the sense amplifiers is read to the outside of the memory 10 from the sense amplifiers. Specific examples of the data write operation and the data read operation are the same as those described in the first embodiment.

Specific Example 1

As a specific example 1, by changing the flag, each memory cell block can be changed to the diagonally accessible block or the fully accessible block. For example, all the blocks BLOCK0 to BLOCKm within the memory cell array 100 shown in FIG. 2 are initially used as diagonally accessible blocks. By doing so, all the blocks can be accessed at high rate. If data is written to all the blocks BLOCK0 to BLOCKm, certain one of the blocks BLOCK0 to BLOCKm is changed from the diagonally accessible block to the fully accessible block. By doing so, data stored in the two diagonally accessible blocks is flexibly compressed into one fully accessible block. New data can be written to the diagonally accessible blocks released by the flexible compression. If the amount of written data is large, the memory 10 can store therein a large capacity of data by changing all the blocks BLOCK0 to BLOCKm to fully accessible blocks. By doing so, if the amount of written data is small, the blocks BLOCK0 to BLOCKm are used as diagonally accessible blocks and the memory 10 can realize high rate access. If the amount of written data is large, the blocks BLOCK0 to BLOCKm are used as fully accessible blocks and the memory 10 can store therein a large capacity of data.

Specific Example 2

Each memory cell block can be fixed to a diagonally accessible block or a fully accessible block in advance. For example, half of the blocks BLOCK0 to BLOCKm can be set as diagonally accessible block and the other half thereof can be set as fully accessible blocks. In the specific example 1, if all the blocks are fully accessible blocks, the sense amplifiers cannot access the memory cells MCs at high rate. However, in a specific example 2, since half the blocks are secured as the diagonally accessible blocks, the high rate access can be always ensured. Nevertheless, since all the blocks cannot be set as the fully accessible blocks, a maximum storage capacity in the specific example 2 is smaller than that in the specific example 1. In this case, it is often preferable that each of the memory cells MCs shown in FIG. 4 is larger in area than each of the memory cells MC*s shown in FIG. 4. Generally, if an area of a memory cell MC is smaller, electric characteristics of the memory cell MC such as data retention characteristic and data write characteristic tend to be deteriorated. By making the memory cells MCs used in the diagonally accessed blocks to be accessed at high rate larger in area and making the memory cells MC*s not used in the diagonally accessed blocks to be accessed at high rate smaller, it is possible to realize providing a memory further ensuring a stable high rate operation and minimizing the entire memory region.

Specific Example 3

Two out of the blocks BLOCK0 to BLOCKm can be set as diagonally accessible blocks and the other blocks can be all set as fully accessible blocks. In this case, whenever data is stored in the two diagonally accessible blocks, the data is compression-copied to one fully accessible block. Since the blocks other than the two blocks are fully accessible blocks, a maximum storage capacity in a specific example 3 is larger than that in the specific example 2 and close to that in the specific example 1. Furthermore, since the two diagonally accessible blocks are secured, the high access can be ensured. Nevertheless, if an amount of data written once is larger than the storage capacity of each diagonally accessible block, the data write rate may possibly be reduced.

Specific Example 4

As a specific example 4, among the blocks BLOCK0 to BLOCKm, n blocks can be set as diagonally accessible blocks and the other blocks can be set as fully accessible blocks. The number "n" of diagonally accessible blocks can be arbitrarily set. For example, the user can select the number "n" of diagonally accessible blocks. More specifically, the numeric value "n" is designed to be able to be changed by stages by providing a physical switch in the card, stick or the like into which the memory is incorporated and by user's operating the physical switch. If the user puts the magnitude of the storage capacity above the high rate access, the user changes over the physical switch so as to reduce the "n". If the user puts the high rate access above the magnitude of the storage capacity, the user changes over the physical switch so as to increase the "n". By changing modes of the memory 10 according to a user utilization situation, it is possible to meet diverse demands of user's.

The number "n" of the diagonally accessible blocks can be changed over using a virtual switch on software by changing programs of the external NAND controller 220 (FIG. 1). In this case, the "n" can be set according to a user's intended purpose.

Specific Example 5

A physical switch or a virtual switch can be provided so as to selectively use the specific examples 1 to 3. For example, a mode of the memory 10 is initially set to a mode corresponding to the specific example 1 and the user can select a mode corresponding to the specific example 2 or 3 if the user gives more importance to the large storage capacity or the high rate access.

According to the second embodiment, it is possible to realize both the large storage capacity of the memory 10 and the high rate access to the memory 10 by the predetermined setting or user's setting. Further, it is possible to put one of the large storage capacity of the memory 10 and the high rate access to the memory 10 above the other by the predetermined setting or user's setting.

In the specific examples 1 to 5, the access method is set in units of blocks. Alternatively, the access method can be set in units of arrays or in units of word lines (pages) as already stated.

Third Embodiment

Figure 9:
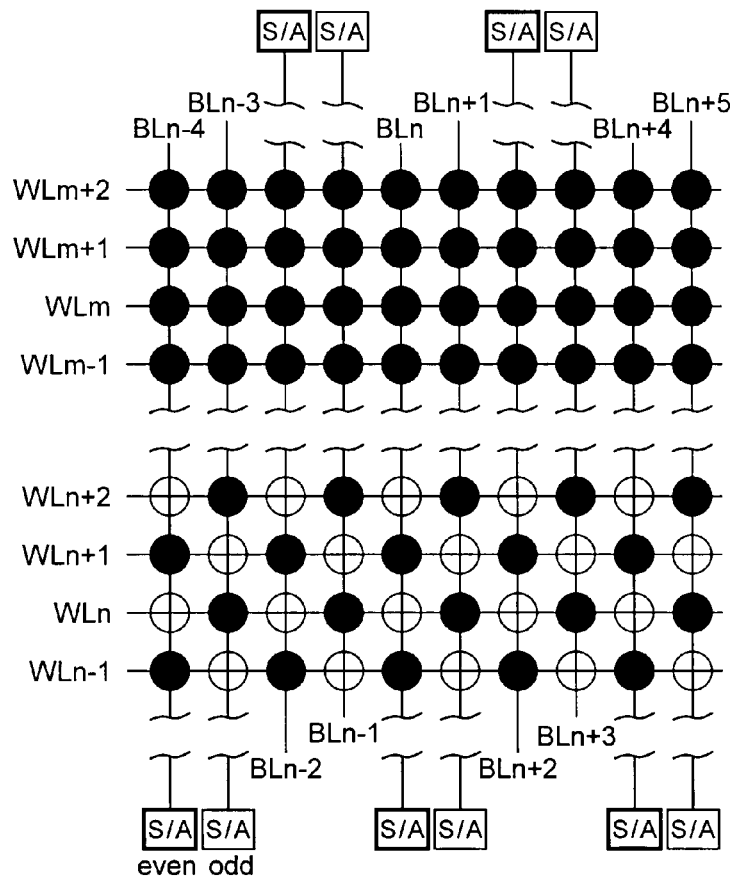
FIG. 9 is a schematic diagram showing an example of a configuration of a memory 10 according to a third embodiment of the present invention.

FIG. 9 is a schematic diagram showing an example of a configuration of a memory 10 according to a third embodiment of the present invention. The memory cell 10 according to the third embodiment includes a diagonally accessible region in which sense amplifiers access memory cells MCs arranged diagonally in the form of a lattice and a fully accessible region in which sense amplifiers can access all memory cells MCs, in one memory cell array 100. A memory region connected to a part of word lines WLn−1 to WLn+2 corresponds to the diagonally accessible region. A memory region connected to the other word lines WLm−1 to WLm+2 corresponds to the fully accessible region. In one example of the third embodiment, each NAND string NS includes both a diagonally accessible part and a fully accessible part. It is, however, preferable that one plane (a region surrounded by sense amplifiers and a row decoder) includes a diagonally accessible region and a fully accessible region and that the diagonal access or the full access can be assigned to each block.

To discriminate whether a certain word line WL is included in the diagonally accessible region or the fully accessible region, a flag set to each word line WL is used. The flag can be one-bit data and is stored in the ROM 120. Alternatively, the flag can be held in various setting bits present for every word line WL.

If a selected word line WL is included in the fully accessible region, data is read by ABL (All Bit Line) method similarly to the conventional technique. In this case, the sense amplifiers read data on all columns connected to the selected word line WL, respectively. That is, the sense amplifiers corresponding to all the columns operate. A part of or all of the data read by the sense amplifiers is read to the outside of the memory 10 from the sense amplifiers.

If the selected word line WL is included in the diagonally accessible region, the sense amplifiers connected to odd bit lines or those connected to even bit lines read data according to an address of the selected word line WL. A part of or all of the data read by the sense amplifiers is read to the outside of the memory 10 from the sense amplifiers. In this case, only one of the sense amplifiers corresponding to the odd bit lines (odd columns) or those corresponding to the even bit lines (even columns) operate. That is, only half of the sense amplifiers corresponding to all columns operate whereas the remaining half thereof is stopped. At this time, there is no need to flow current to the stopped sense amplifiers. Accordingly, current paths from the stopped sense amplifiers to the memory cells MCs are cut off. In this way, by stopping supply of current from the stopped sense amplifiers to the memory cells MCs, it is possible to not only reduce power consumption by half but also reduce current flowing into a cell source during the data read operation by half. The "cell source" corresponds to the common source line SL shown in FIG. 3. If the amount of current flowing into the cell source is large, a source potential VSL rises and the sense amplifiers may possibly erroneously detect data. Therefore, by halving the current flowing into the cell source, data misdetection can be prevented.

Moreover, since potentials of either the even bit lines or the odd bit lines are fixed, the shield effect suppressing the capacitive coupling between the bit lines BLs propagating data is produced. The shield effect can reduce noise received by activated bit lines BLs, so that the sense amplifiers can stably execute the data read operation. As can be seen, the diagonal access can provide a small noise environment as compared with the conventional access such as the ABL-based access. As a result, the diagonal access enables accelerating the data write rate and the data read rate as compared with the conventional technique.

As shown in FIG. 9, the word lines WLs subjected to the diagonal access can be separated from those subjected to the full access. Alternatively, the word lines WLs subjected to the diagonal access and those subjected to the full access can be mixed up. For example, the word lines WLs subjected to the diagonal access and those subjected to the full access can be set alternately according to rows.

Fourth Embodiment

In one diagonal access block, the non-accessed memory cells MC*s shown in FIG. 4 is not subjected to a data write operation but to a repeated erasure operation. Accordingly, the memory cells MC*s may possibly turn into over-erased states. To prevent this, in a fourth embodiment of the present invention, the data write operation is performed before the data erasure operation and electrons are injected into the floating gate of each of the memory cells MC*s. The data write operation before the data erasure operation is referred to as "pre-program". Furthermore, after the data erasure operation, the sense amplifiers inject electrons into the floating gate of each of the memory cells MC*s. The data write operation after the data erasure operation is referred to as "soft-program". By performing each of or one of the pre-program and the soft-program on the memory cells MC*s, it is possible to suppress the memory cells MC*s from turning into over-erased states. Each of or one of the pre-program and the soft-program can be performed on the memory cells MC*s for every data erasure operation or at intervals of k (where k is a natural number) data erasure operations.

Fifth Embodiment

In the diagonal access block, the memory cells MCs shown in FIG. 4 are repeatedly accessed, so that the memory cells MCs are deteriorated. On the other hand, since the non-accessed memory cells MC*s are not used, the degree of deterioration of the memory cells MC*s is quite low. Therefore, in a fifth embodiment of the present invention, to prolong the service life of the memory 10, access settings of the memory cells MCs and the memory cells MC*s are exchanged with each other if the number of accesses to the memory cells MCs is equal to or larger than a predetermined number. That is, if the number of accesses to the memory cells MCs is equal to or larger than the predetermined number, the memory cells MCs that have been accessible so far are changed to non-accessed memory cells MC*s and the memory cells MC*s that have not been accessed so far are changed to accessible memory cells MCs. By so setting, all the memory cells MCs and MC*s in each block can be efficiently used and the service life of the memory 10 can be prolonged.

If the access settings of the memory cells MCs are changed, it is necessary to change data on the flags stored in the ROM 120. This is because the even or odd-numbered sense amplifiers activated to correspond to a certain word line WL are changed to odd or even-numbered sense amplifiers.

Sixth Embodiment

Moreover, if the microfabrication of the memory 10 proceeds, the influence of the proximity effect possibly appears even if the diagonal access according to the above embodiments is used. For example, in a generation in which a minimum line width is equal to or smaller than 20 nm, it is considered that the influence of the proximity effect on the diagonally accessible blocks is not negligible. In this case, the DLA method described in the first embodiment can be used. The DLA method is a method of correcting data on the selected word line WLn so as to cancel the noise component based on data on the adjacent word line WLn+1. Alternatively, the multivalued data can be stored in each memory cell MC according to the LM method described in the first embodiment. In a sixth embodiment of the present invention, the proximity effect can be relaxed by using the DLA method or the LM method.

Seventh Embodiment

A memory 10 according to a seventh embodiment of the present invention stores binary data in a diagonally accessible array (diagonally accessible blocks) and stores multivalued data in a fully accessible array (fully accessible blocks). The binary data can be read or written at higher rate than that for reading or writing the multivalued data. The multivalued data is larger in capacity than the binary data. The memory 10 according to the seventh embodiment uses such characteristics of the binary data and the multivalued data. By storing binary data in the diagonally accessible array (diagonally accessible blocks), high rate access to the diagonally accessible array (diagonally accessible blocks) is ensured. By storing multivalued data in the fully accessible area (fully accessible blocks), the capacity of the fully accessible array (fully accessible blocks) can be further increased.

That is, an amount of data stored in each memory cell MC (the number of bits per memory cell MC) in the fully accessible array (fully accessible blocks) is set larger than that of data stored in each memory cell MC in the diagonally accessible array (diagonally accessible blocks), whereby the memory 10 can store therein a larger capacity of data.

However, with views of simplifying the design of the NAND controller 220, it is often preferable to set the number of bits stored in each memory cell MC in the diagonally accessible array (diagonally accessible blocks) equal to that of bits stored in each memory cell MC in the fully accessible array (fully accessible blocks). Accordingly, the number of bits stored in each memory cell MC in the diagonally accessible array (diagonally accessible blocks) and that of bits stored in each memory cell MC in the fully accessible array (fully accessible blocks) can be set based on the high rate access, the large storage capacity, the design and the like. Note that both diagonally accessible memory cells MCs and fully accessible memory cells MCs can store therein both the binary data and the multivalued data.

(Access to Diagonally Accessible Block)

Figure 10:
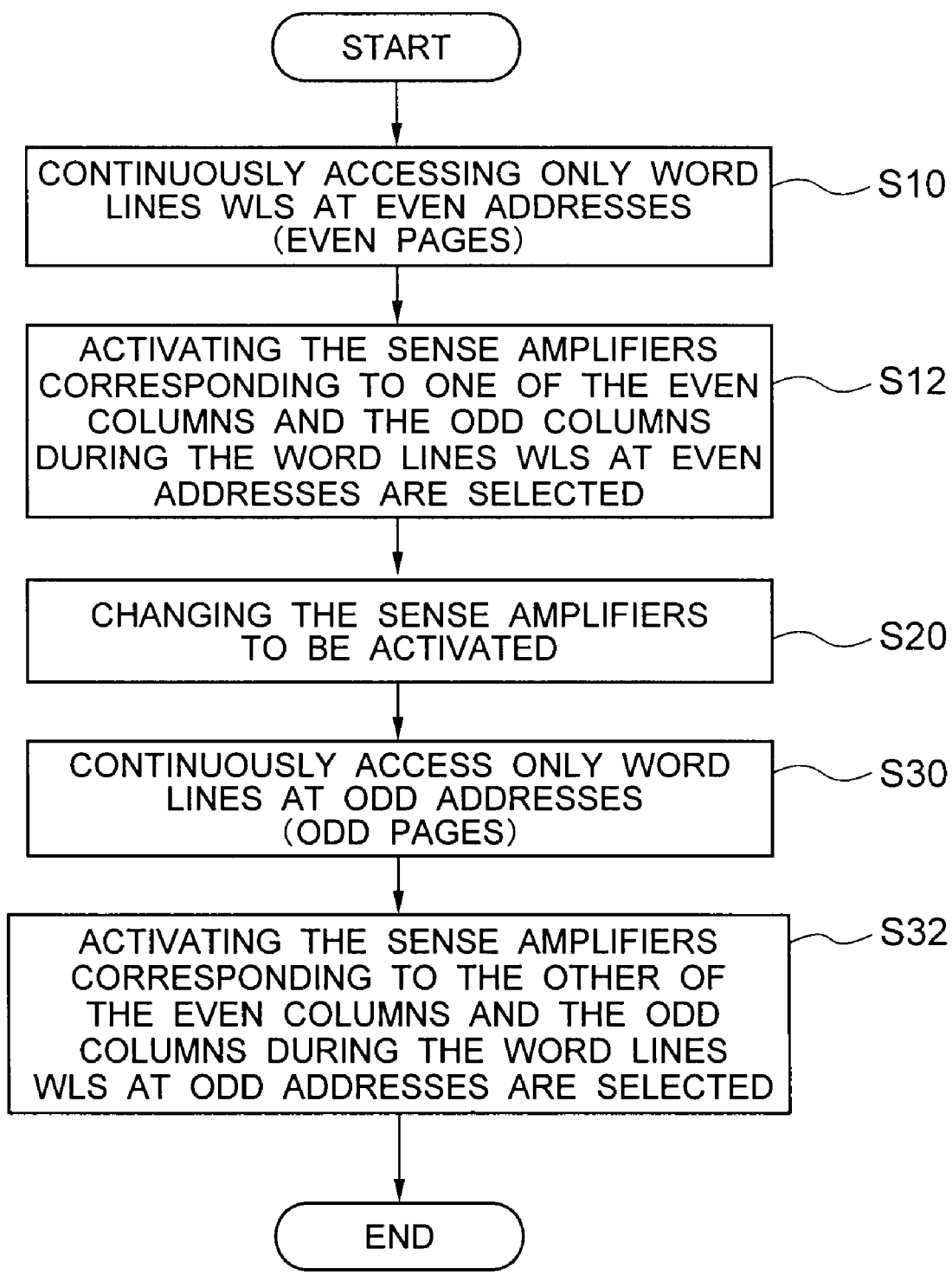
FIG. 10 is a flowchart showing an example of an order of accesses to the word lines WLs included in the diagonally accessible block.

FIG. 10 is a flowchart showing an example of an order of accesses to the word lines WLs included in the diagonally accessible block. In the example shown in FIG. 10, if the word lines WL included in the diagonally accessible block are to be accessed, the sense amplifier group 40 continuously accesses only word lines WLs at even addresses (even pages) (S10) and then continuously access only word lines at odd addresses (odd pages) (S30). Conversely, the sense amplifier group 40 can continuously accesses only word lines WLs at odd addresses (odd pages) and then continuously access only word lines at even addresses (even pages). That is, the even word lines WL(2i) and the odd word lines WL(2i+1) are separately selected.

As shown in FIG. 4, in the diagonally accessible block, the accessible memory cells MCs are arranged on the two adjacent word lines WLs while being alternately shifted by one pitch. Therefore, while the even word lines WL(2i) are continuously selected, it suffices to access either the even bit lines BLs or the odd bit lines BLs. That is, while the even word lines WL(2i) are continuously selected, it suffices to activate the sense amplifiers corresponding to either the even columns or the odd columns and to stop the other sense amplifiers (S12).

On the other hand, while the odd word lines WL(2i+1) are continuously selected, it suffices to access either the even bit lines BLs or the odd bit lines BLs. That is, while the odd word lines WL(2i+1) are continuously selected, it suffices to activate the sense amplifiers corresponding to either the even columns or the odd columns and to stop the other sense amplifiers (S32).

The sense amplifiers to be activated are changed over only when the selected word line WL is changed from the even word line WL(2i) to the odd word line WL(2i+1) or from the odd word line WL(2i+1) to the even word line WL(2i) (S20).

In this way, by separately accessing the word lines WL(2i) at even addresses and the word lines WL(2i+1) at odd addresses, the number of changeovers of the sense amplifiers to be activated can be minimized. Alternatively, the method of sequentially accessing the word lines WLs can be used similarly to the conventional technique. In this alternative, it is necessary to change over the sense amplifiers to be activated for every word line WL.

The access methods of accessing the diagonally accessible block described above are applicable to each of the first to seventh embodiments.

The NAND flash memory according to the present invention can be used in a memory card such as a compact flash, an SD card or a memory stick, a USB memory or the like.

The invention claimed is:

1. A nonvolatile semiconductor memory device comprising:
a plurality of memory cell arrays respectively including a plurality of word lines extending in a first direction, a plurality of bit lines extending in a second direction crossing the first direction, and a plurality of memory cells provided to respectively correspond to cross-points in form of a lattice constituted by the word lines and the bit lines;
a plurality of sense amplifiers provided to respectively correspond to the bit lines and reading data stored in the memory cells; and
bit line drivers provided to the bit lines and operating the bit lines when data is written to the memory cells, wherein
the bit line drivers access the memory cells adjacent to a first memory cell diagonally with respect to the form of the lattice for writing the data to the adjacent memory cells during a data write operation without changing data stored in the memory cells adjacent to the first memory cell in the first and the second directions.

2. The nonvolatile semiconductor memory device according to claim 1, comprising:
a plurality of memory cell blocks including a plurality of memory cells, wherein
after the data is written to memory cell blocks diagonally with respect to the memory cells in the form of the lattice, the data of the plural memory cell blocks is collectively compression-copied into one memory cell block.

3. The nonvolatile semiconductor memory device according to claim 1, wherein
the memory cell arrays include a fully accessible region in which the sense amplifiers can access all the memory cells and a diagonally accessible region in which the sense amplifiers access the memory cells arranged diagonally with respect to the form of the lattice, and
the fully accessible region and the diagonally accessible region are set for each of word lines.

4. The nonvolatile semiconductor memory device according to claim 1, wherein
the memory cell arrays include a fully accessible region in which the sense amplifiers can access all the memory cells and a diagonally accessible region in which the sense amplifiers access the memory cells arranged diagonally with respect to the form of the lattice, and
the fully accessible region and the diagonally accessible region are set for each of memory cell blocks.

5. The nonvolatile semiconductor memory device according to claim 1, wherein
accessible memory cells in the memory cell arrays are arranged in form of a checkered flag, and
non-accessible memory cells in the memory cell arrays are arranged between two of the accessible memory cells adjacent to each other.

6. The nonvolatile semiconductor memory device according to claim 5, wherein when certain one of the bit lines is connected to the non-accessible memory cells, a potential of the certain bit line is fixed.

7. The nonvolatile semiconductor memory device according to claim 1, wherein the nonvolatile semiconductor memory device is a NAND flash memory.

8. The nonvolatile semiconductor memory device according to claim 1, wherein the nonvolatile semiconductor memory device is a resistance random access memory.

9. A nonvolatile semiconductor memory device comprising:
a plurality of memory cell arrays respectively including a plurality of word lines extending in a first direction, a plurality of bit lines extending in a second direction crossing the first direction, and a plurality of memory cells provided to respectively correspond to cross-points in form of a lattice constituted by the word lines and the bit lines;

a plurality of sense amplifiers provided to respectively correspond to the bit lines and reading data stored in the memory cells; and bit line drivers provided to the bit lines and operating the bit lines when data is written to the memory cells, wherein the sense amplifiers or the bit line drivers access intermittent memory cells arranged alternately for each of the word lines and select the intermittent memory cells so as to be shifted each by one pitch whenever an adjacent word line is selected.

10. The nonvolatile semiconductor memory device according to claim 9, comprising:

a plurality of memory cell blocks including a plurality of memory cells, wherein after the data is written to memory cell blocks diagonally with respect to the memory cells in the form of the lattice, the data of the plural memory cell blocks is collectively compression-copied into one memory cell block.

11. The nonvolatile semiconductor memory device according to claim 9, wherein the memory cell arrays include a fully accessible region in which the sense amplifiers can access all the memory cells and a diagonally accessible region in which the sense amplifiers access the memory cells arranged diagonally with respect to the form of the lattice, and the fully accessible region and the diagonally accessible region are set for each of word lines.

12. A method of driving a nonvolatile semiconductor memory device, the nonvolatile semiconductor memory device including: a plurality of memory cell arrays respectively including a plurality of word lines extending in a first direction, a plurality of bit lines extending in a second direction crossing the first direction, and a plurality of memory cells provided to respectively correspond to cross-points in form of a lattice constituted by the word lines and the bit lines;

a plurality of sense amplifiers provided to respectively correspond to the bit lines and reading data stored in the memory cells; and bit line drivers provided to the bit lines and operating the bit lines when data is written to the memory cells, the method comprising:

during a data write operation or a data read operation, electrically connecting the sense amplifiers or the bit line drivers to first intermittent bit lines provided alternately among the plurality of bit lines in a state of selecting a first word line; and electrically connecting the sense amplifiers or the bit line drivers to second intermittent bit lines adjacent to the first intermittent bit lines and provided alternately among the plurality of bit lines in a state of selecting a second word line adjacent to the first word line.

13. The method according to claim 12, wherein the bit line drivers access the memory cells adjacent to a first memory cell diagonally with respect to the form of the lattice for writing the data to the adjacent memory cells during a data write operation without changing data stored in the memory cells adjacent to the first memory cell in the first and the second directions.

14. The method according to claim 13, wherein the nonvolatile semiconductor memory device further includes a plurality of memory cell blocks including a plurality of memory cells, and after the data is written to memory cell blocks diagonally with respect to the memory cells in the form of the lattice, the data of the plural memory cell blocks is collectively compression-copied into one memory cell block.

15. The method according to claim 13, wherein the memory cell arrays include a fully accessible region in which the sense amplifiers can access all the memory cells and a diagonally accessible region in which the sense amplifiers access the memory cells arranged diagonally with respect to the form of the lattice, and the fully accessible region and the diagonally accessible region are set for each of word lines.

16. The method according to claim 13, wherein the memory cell arrays include a fully accessible region in which the sense amplifiers can access all the memory cells and a diagonally accessible region in which the sense amplifiers access the memory cells arranged diagonally with respect to the form of the lattice, and the fully accessible region and the diagonally accessible region are set for each of memory cell blocks.

17. The method according to claim 12, wherein during a data write operation or a data read operation, potentials of the second intermitted bit lines are fixed in a state of selecting a first word line, and potentials of the first intermittent bit lines are fixed in a state of selecting a second word line.

18. The method according to claim 13, wherein during a data write operation or a data read operation, potentials of the second intermitted bit lines are fixed in a state of selecting a first word line, and potentials of the first intermittent bit lines are fixed in a state of selecting a second word line.

19. The method according to claim 12, wherein the nonvolatile semiconductor memory device is a NAND flash memory.

20. The method according to claim 12, wherein the nonvolatile semiconductor memory device is a resistance random access memory.

* * * * *